(12) United States Patent
Son

(10) Patent No.: US 8,963,887 B2
(45) Date of Patent: Feb. 24, 2015

(54) OPTICAL TOUCH SCREEN AND METHOD FOR ASSEMBLING THE SAME

(75) Inventor: Sukwoo Son, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 123 days.

(21) Appl. No.: 13/808,016

(22) PCT Filed: Jul. 11, 2011

(86) PCT No.: PCT/KR2011/005047
§ 371 (c)(1),
(2), (4) Date: Jan. 2, 2013

(87) PCT Pub. No.: WO2012/018176
PCT Pub. Date: Feb. 9, 2012

(65) Prior Publication Data
US 2013/0100084 A1 Apr. 25, 2013

(30) Foreign Application Priority Data
Aug. 2, 2010 (KR) .................. 10-2010-0074588

(51) Int. Cl.
*G06F 3/042* (2006.01)
*H05K 13/00* (2006.01)

(52) U.S. Cl.
CPC .............. *G06F 3/042* (2013.01); *G06F 3/0428* (2013.01); *H05K 13/00* (2013.01)

USPC .......................................... 345/175

(58) Field of Classification Search
None
See application file for complete search history.

(56) References Cited

U.S. PATENT DOCUMENTS

| 5,708,460 A * | 1/1998 | Young et al. ............... 345/173 |
| 6,498,602 B1 * | 12/2002 | Ogawa .......................... 345/173 |
| 2005/0200613 A1 | 9/2005 | Kobayashi et al. |
| 2006/0007185 A1 | 1/2006 | Kobayashi et al. |

FOREIGN PATENT DOCUMENTS

| JP | 2001-142643 A | 5/2001 |
| JP | 2005-276019 A | 10/2005 |
| KR | 10-2006-0043857 A | 5/2006 |
| KR | 10-2009-0092878 A | 9/2009 |
| KR | 10-0919437 B1 | 9/2009 |
| KR | 20-0448650 Y1 | 5/2010 |

* cited by examiner

*Primary Examiner* — Nicholas Lee
(74) *Attorney, Agent, or Firm* — Birch, Stewart, Kolasch & Birch, LLP

(57) ABSTRACT

The present invention relates to an optical touch screen and a method for assembling the same, the screen including a flat plate display panel; a case mounted and assembled with the flat plate display panel; brackets assembled at each corner of the case; a camera module mounted at each bracket; and a retro reflector arranged along an inner lateral surface of the case.

16 Claims, 4 Drawing Sheets

OPTICAL TOUCH SCREEN AND METHOD FOR ASSEMBLING THE SAME

TECHNICAL FIELD

The teachings in accordance with the exemplary embodiments of this invention relate generally to an optical touch screen and a method for assembling the same.

BACKGROUND ART

A touch screen or touch panel is a display which can detect a location of touch within a display area, usually performed either with the human hand or a stylus. This allows the display to be used as an input device, removing a keyboard and/or a mouse as a primary input device for interacting with the display's content.

Technically speaking, the commonly used touch screens employ resistive, capacitive, ultrasonic wave, electromagnetic, vector force and optical (Infrared) touch modes. Among these types of touch screens, resistive type is the most common one, which has approximately 60% of market share (the second is capacitive type with around 24% of market share). Each of these types of touch screens has its own features, advantages and disadvantages. Now, these touch screens are briefly explained.

The resistive is a common type of touch screen technology. It is a low-cost solution found in many touch screen applications, including hand-held computers, PDA's, consumer electronics, and point-of-sale-applications. The resistive touch screens are such that a pair of resistive layers facing with each other is provided on a touch screen element. The pressed position is detected by contact between the resistive layers so that one of the resistive layers is formed on a flexible film for deformation during pressing. As mentioned above, the resistive film type is widely used, but disadvantageous due to degraded mechanical and environmental reliability. At the same time, although the resistive touch screen today are widely used on consuming electronic products, it is unable to identify multiple contact points simultaneously on its display area.

The ultrasonic wave touch screen first converts an electric signal into an ultrasonic wave through a transducer, and then directly transmits the ultrasonic wave through a surface of the touch panel. When the touch panel is used, the ultrasonic wave may be absorbed by contacting a pointer to cause attenuation, and an accurate position of the contact is obtained through comparison and calculation between attenuation amounts before and after use. The surface acoustic wave touch screen is disadvantageous due to generation of noise and/or susceptibility to noise.

The electromagnetic type touch screen is such that, in the field of magnetism, a magnetic field is normally generated by a coil due to electromagnetism and said magnetic field induces a voltage in another coil, also called receiver coil, under the premise that the magnetic field strength changes in the receiver coil. It is clear that a non-moving receiver coil is not capable to measure a non-altering magnetic field since no voltage is induced by said magnetic field. There are already means, which can measure a position and/or orientation of a receiver means in relation to a specific magnetic field generating means. To measure the orientation in a 3-dimensional space normally three orthogonal arranged probes are used to calculate the coordinates. These arrangements are most of the time very bulky, space taking and need a special stylus.

The capacitance type touch screen adopts capacity changes generated from the combination of static electricity between arranged transparent electrodes and a human body, so as to detect coordinates of the contact position through a generated induced current. That is, the capacitance type touch screen includes one substrate having an electrode formed thereon. In the capacitance type touch panel, when, for example, a finger contacts and approaches the touch panel, a variation in capacitance between the electrode and the finger is detected, thereby detecting input coordinates. Since the capacitance type touch panel is a non-contact type, it has high durability, excellent environmental and mechanical reliability due to changeable upper barrier layer unlike the resistive film type touch panel. However, the capacitance type touch panel has disadvantages in that it is difficult to input information with fingers or a pen.

The optical type touch screens principally use no films for touch recognition such that transmittance is 100%. Furthermore, no reflexibility, degradation of brightness and blurring of displays are generated from these optical touch screens. Maintenance of transmittance and brightness in displays is an important factor for image clarity, such that an optical type is adequate for implementation of high quality screens. Furthermore, the optical type touch screens utilize the principle of light source reception and blocking, such that no load is applied to a sensor as detection is not performed by physical or electrical contacts, which increases reliability for use in factory monitoring, various automation equipment and ATM's. The optical type touch screens are advantageously free from such materials as films or ITO (Indium Tin Oxide) protective films to have less susceptibility to scratches or external shocks and a lower error probability including erroneous operation.

DISCLOSURE OF INVENTION

Technical Problem

The present invention is directed to solving an object of performing an easy assembly of an optical touch screen.

Technical problems to be solved by the present invention are not restricted to the above-mentioned, and any other technical problems not mentioned so far will be clearly appreciated from the following description by skilled in the art.

Solution to Problem

An object of the invention is to solve at least one or more of the above problems and/or disadvantages in a whole or in part and to provide at least the advantages described hereinafter. In order to achieve at least the above objects, in whole or in part, and in accordance with the purposes of the invention, as embodied and broadly described, and in one general aspect of the present invention, there is provided an optical touch screen, the optical touch screen comprising: a flat plate display panel; a case mounted and assembled with the flat plate display panel; brackets assembled at each corner of the case; a camera module mounted at each bracket; and a retro reflector arranged along an inner lateral surface of the case.

Preferably, the optical touch screen further includes a frame mounted at an inner lateral surface between the brackets, wherein the retro reflector is mounted at the frame.

Preferably, the case takes the shape of a square ring.

Preferably, the brackets include first and second fixtures fixed on the case, and a connection connected to the first and second fixtures, wherein the camera module is mounted at the connection.

Preferably, the connection of the bracket includes a first passage through which infrared (IR) emitted from the camera module can pass, and a second passage through which infrared (IR) incident on the camera module can pass.

Preferably, the retro reflector is mounted on the first and second fixtures.

Preferably, the frame is formed with a groove, and the retro reflector is formed with a lug insertable to the groove, wherein the lug formed at the retro reflector is inserted into the groove formed at the frame, whereby the retro reflector is mounted at the frame.

Preferably, the camera module includes an IR emitting diode emitting IR; an IR pass filter passing only the IR reflected from the retro reflector; and a linear sensor detecting an area touched by incidence of IR that has passed the IR pass filter.

Preferably, the camera module includes a holder formed with a stair unit and an opening; an IR emitting diode mounted at the stair unit for emitting IR; and an image sensor detecting the IR through the opening.

Preferably, the stair unit is formed at an upper surface of the holder, and the opening is formed at a bottom surface of the holder.

Preferably, the holder is formed at one side with a first groove and is formed at the other side with a second groove, and the opening connects the first groove and the second groove, and the stair unit is formed at an upper surface of the one side.

Preferably, the first groove is formed with an objective lens, the second groove is formed with an infrared pass filter that passes an infrared of a particular wave band, and a printed circuit board mounted with the image sensor is attached to the holder for blocking the second groove.

Preferably, the IR pass filter is implemented by coating an IR pass filter material on a glass.

In another general aspect of the present invention, there is provided a method for assembling an optical touch screen, the method comprising: preparing a bracket mounted with a camera module and a square ring-shaped case; fixing the bracket at each corner of the case; fixing a retro reflector on the case; and mounting a flat plate display panel on the case.

Preferably, the brackets include first and second fixtures fixed on the case, and a connection connected to the first and second fixtures, wherein the camera module is mounted at the connection.

Preferably, the camera module is formed with a first fastening lug, the first and second fixtures of the bracket are formed with second and third fastening lugs, and the case is formed with first, second and third fastening holes corresponding to the first, second and third fastening lugs, wherein the first, second and third fastening lugs are inserted into the first, second and third fastening holes to allow the camera module and the bracket to be mounted at the case.

Preferably, the step of fixing the bracket at each corner of the case is performed in such a manner that three inner corners of the square ring-shaped case are fixed by brackets on which the camera module is mounted, and one inner corner of the square ring-shaped case is mounted with a dummy bracket on which the camera module is not mounted.

Preferably, the camera module includes a holder formed with a stair unit and an opening; an IR emitting diode mounted at the stair unit for emitting IR; and an image sensor detecting the IR through the opening.

Preferably, the stair unit is formed at an upper surface of the holder, and the opening is formed at a bottom surface of the holder.

Preferably, the holder is formed at one side with a first groove and is formed at the other side with a second groove, and the opening connects the first groove and the second groove, and the stair unit is formed at an upper surface of the one side.

Advantageous Effects of Invention

The present invention has an advantageous effect in that a camera module can be easily mounted on a case through a bracket, a retro reflector can be easily assembled on a frame mounted on the case, and each constituent element can simply perform a mechanical arrangement for normally realizing an operational mechanism of an optical touch screen.

The present invention has another advantageous effect in that the camera module and the retro reflector need no mount on a high-priced reinforced glass to reduce the manufacturing cost.

The present invention has still another advantageous effect in that a frame and the bracket are formed with grooves, and the retro reflector is formed with a lug to allow the retro reflector to be easily fastened on the frame and the bracket by way of shield bar (rail) coupling method.

BRIEF DESCRIPTION OF DRAWINGS

The teachings of the present invention can be readily understood by considering the following detailed description in conjunction with the accompanying drawings, in which.

BEST MODE FOR CARRYING OUT THE INVENTION

Figure 1:
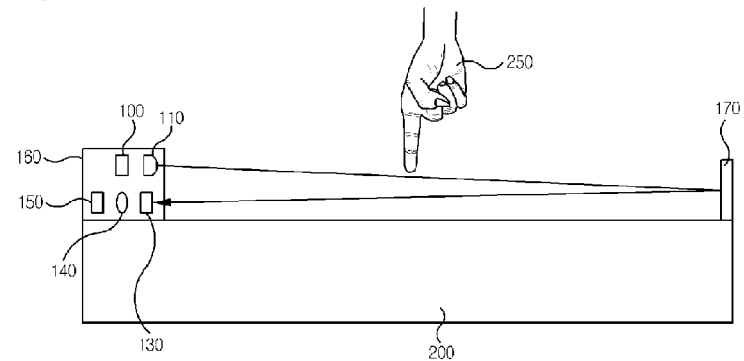
FIG. 1 is a conceptual cross-sectional view illustrating an optical touch screen according to the present invention.

The following description is not intended to limit the invention to the form disclosed herein. Consequently, variations and modifications commensurate with the following teachings, and skill and knowledge of the relevant art are within the scope of the present invention. The embodiments described herein are further intended to explain modes known of practicing the invention and to enable others skilled in the art to utilize the invention in such, or other embodiments and with various modifications required by the particular application (s) or use(s) of the present invention.

The disclosed embodiments and advantages thereof are best understood by referring to FIGS. 1-12 of the drawings, like numerals being used for like and corresponding parts of the various drawings. Other features and advantages of the disclosed embodiments will be or will become apparent to one of ordinary skill in the art upon examination of the following figures and detailed description. It is intended that all such additional features and advantages be included within the scope of the disclosed embodiments, and protected by the accompanying drawings. Further, the illustrated figures are only exemplary and not intended to assert or imply any limitation with regard to the environment, architecture, or process in which different embodiments may be implemented. Accordingly, the described aspect is intended to embrace all such alterations, modifications, and variations that fall within the scope and novel idea of the present invention.

It will be understood that the terms "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. That is, the terms "including", "includes", "having", "has", "with", or variants thereof may be used in the detailed description and/or the claims to denote non-exhaustive inclusion in a manner similar to the term "characterized by".

Furthermore, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated. That is, in the drawings, the size and relative sizes of layers, regions and/or other elements may be exaggerated or reduced for clarity. Like numbers refer to like elements throughout and explanations that duplicate one another will be omitted. Now, the present invention will be described in detail with reference to the accompanying drawings.

FIG. 1 is a conceptual cross-sectional view illustrating an optical touch screen according to the present invention.

An optical touch screen according to the present invention includes a camera module (160) and a retro reflector (170), all of which are mounted to a front surface of a flat plate display panel (200). The camera module (160) may include an infrared light emitting diode (100) emitting infrared light, an IR (Infrared) pass filter (130) that passes only the infrared reflected from the retro reflector (170), and a linear sensor (150) detecting an area touched by the incident infrared that has passed the IR pass filter (130).

At this time, the optical touch screen may further include an object lens (140) collecting the infrared that has passed the IR pass filter (130). Alternatively, the optical touch screen may be so configured as to allow the light emitted from the infrared light emitting diode (100) to be emitted through a lens (110).

Furthermore, the retro reflector (170) reflects the infrared emitted from the infrared light emitting diode (100), where an incident angle and reflection angle of the infrared are same.

Therefore, the infrared light emitting diode (100) of the camera module (160) emits an infrared, where the emitted infrared advances along the flat plate display panel (200) to be reflected from the retro reflector (170) and incident on the IR pass filter (130) of the camera module (160).

At this time, the IR pass filter (130) passes only the infrared that has been reflected from the retro reflector (170), and the infrared that has passed the IR pass filter (130) is incident on the linear sensor (150). In a case a particular area of the flat plate display panel (200) is touched by a finger of a hand (250) while a user views an image displayed on the flat plate display panel (200), the infrared is blocked from the touched area to form a black spot on the linear sensor (150), whereby a coordinate of the touched particular area can be detected.

Furthermore, the flat plate display panel (200) is situated under an area between the infrared light emitting diode (100) and the retro reflector (170), and in a case a user touches a particular area of an image displayed on the flat plate display panel, a driving signal is generated that corresponds to a coordinate detected by the linear sensor (150), whereby various functions including screen change, sound adjustment, screen movement, screen enlargement and screen reduction can be performed. At this time, the flat plate display panel may be one of an LCD (Liquid Crystal Display), an FED (Field Emission Display), a PDP (Plasma Display Panel), an EL (Electroluminescence), an OLED (Organic Light Emitting Diode), and an electronic paper display panel.

Figure 2:
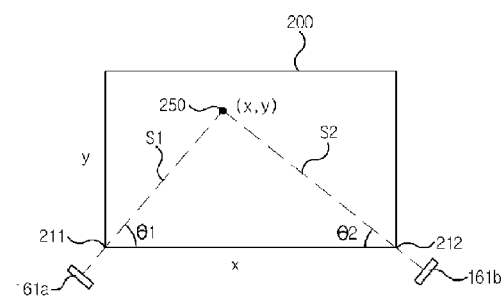
FIG. 2 is a conceptual view illustrating a method for detecting a coordinate of a particular area touched on an optical touch screen according to the present invention.
Figure 3A:
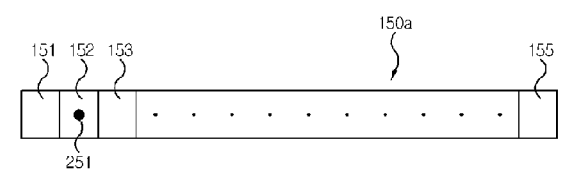
FIGS. 3a and 3b are schematic conceptual views illustrating a linear sensor of an optical touch screen according to the present invention.
Figure 3B:
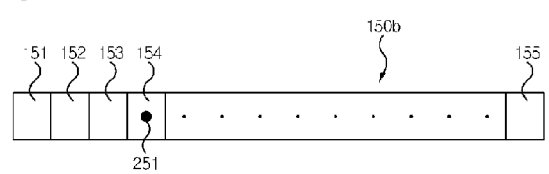

FIG. 2 is a conceptual view illustrating a method for detecting a coordinate of a particular area touched on an optical touch screen according to the present invention, and FIGS. 3a and 3b are schematic conceptual views illustrating a linear sensor of an optical touch screen according to the present invention.

The camera module of the optical touch screen may be installed at two or three corner areas of the flat plate display panel (200). For example, as illustrated in FIG. 2, in a case first and second camera modules (161a, 161b) are mounted on two corner areas (211, 212) of the flat plate display panel (200), and a predetermined area (250) of the flat plate display panel (200) is touched, the touched predetermined area (250) is blocked of infrared, and each linear sensor of the first and second camera module (161a, 161b) is formed with a black spot. Therefore, the linear sensor can detect a coordinate of the touched particular area using a position of the black spot.

Each of the linear sensors (150a, 150b) of the first and second camera module (161a, 161b) is mounted with 1st to nth sensing pixel (151, 152, 153, 154, 155) as illustrated in FIGS. 3a and 3b. At this time, in a case the particular predetermined area of the flat plate display panel (200) is touched, one of the 1st to nth sensing pixel (151, 152, 153, 154, 155) is formed with the black spot. Furthermore, because each of the linear sensors (150a, 150b) of the first and second camera module (161a, 161b) is installed at a different position from that of the touched area, there is a high probability that the sensing pixel of the linear sensor (150a) of the first camera module (161a) is differently positioned from the linear sensor (150b) of the second camera module (161b).

For example, as depicted in FIG. 3a, a black spot (251) is formed at the second sensing pixel (152) on the linear sensor (150a) of the first camera module (161a), and as illustrated in FIG. 3b, a black spot (251) is formed at the fourth sensing pixel (154) on the linear sensor (150b) of the second camera module (161b).

Meanwhile, as shown in FIG. 2, if a crosswise direction of the flat plate display panel (200) is defined as x axis, and a lengthwise direction of the flat plate display panel (200) is defined as y axis, a coordinate of the touched area (250) can be extracted, if a connection line (S1) from the touched area (250) to the linear sensor (150a) of the first camera module (161a), a first angle (θ1) formed by a crosswise direction of the flat plate display panel (200), a connection line (S2) from the touched area (250) to the linear sensor (150b) of the second camera module (161b), a second angle (θ2) formed by a crosswise direction of the flat plate display panel (200) and a crosswise length of the flat plate display panel (200) are known.

Furthermore, the first angle (01) and the second angle (θ2) are changed according to the position of the touched area (250), and in response thereto, the 1st to the nth sensing pixel (151, 152, 153, 154, 155) of the linear sensors (150a, 150b) are subdivided. That is, each of the 1st to the nth sensing pixel (151, 152, 153, 154, 155) of the linear sensors (150a, 150b) corresponds to the first angle (θ1) and the second angle (θ2).

Therefore, in a case a black spot is formed on one of the sensing pixel of the 1st to the nth sensing pixel (151, 152, 153, 154, 155) of the linear sensors (150a, 150b) on the first and second camera modules (161a, 161b), the first angle (θ1) and the second angle (θ2) can be known, whereby a coordinate (x, y) of the touched area (250) can be extracted.

Furthermore, the optical touch screen may include a coordinate extraction calculator capable of extracting real time a coordinate (x, y) of the touched area (250) touched by the aforementioned method or other methods, in a case a predetermined area (250) of the flat plate display panel (200) is touched.

Figure 4:
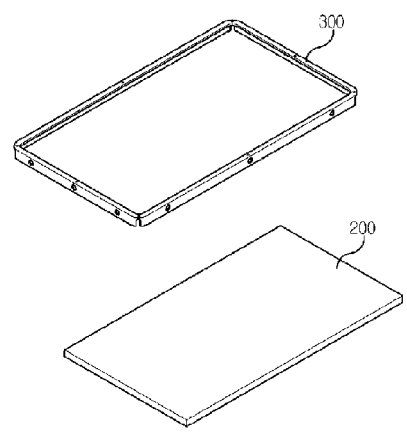
FIG. 4 is a schematic perspective view illustrating a state in which an optical touch screen is fastened according to the present invention.
Figure 5:
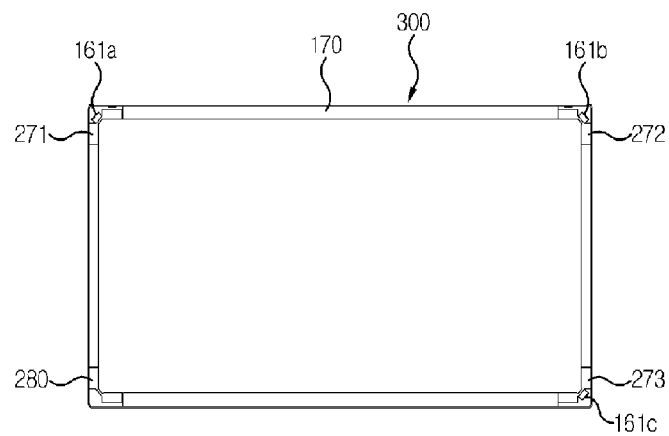
FIG. 5 is a schematic plan illustrating a case of an optical touch screen according to the present invention.

FIG. 4 is a schematic perspective view illustrating a state in which an optical touch screen is fastened according to the present invention, and FIG. 5 is a schematic plan illustrating a case of an optical touch screen according to the present invention.

The optical touch screen according to the present invention may include a case (300) on which the flat plate display panel (200) is mounted, where the case (300) may be called a case top. The case (300) takes the shape of a square ring, and as shown in FIG. 5, an inner lateral surface of the square ring is mounted with the retro reflector (170), and two or three corner areas of the square ring is mounted and assembled with camera modules (161a, 161b, 161c).

At this time, the camera modules (161a, 161b, 161c) are mounted on brackets (271, 272, 273), and each of the brackets (271, 272, 273) is mounted at three square ring corners. Furthermore, a balance one square ring corner is mounted with a dummy bracket (280) that is not mounted with a camera module. That is, the optical touch screen includes the flat plate display panel (200), the square ring-shaped case (300) on which the flat plate display panel (200) is assembled and attached, the brackets assembled on corners of the case (300), and the camera modules (161a, 161b, 161c). At least one of the brackets is a bracket that is not mounted with the camera modules (161a, 161b, 161c). An inner lateral surface of the case (300) in the brackets is mounted with the retro reflector (170). The retro reflector (170) is also mounted on the dummy bracket (280).

FIGS. 6a through 6d are schematic plans illustrating a method of assembling an optical touch screen according to the present invention.

Figure 6A:
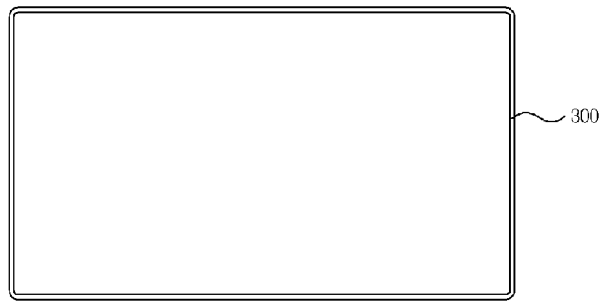
FIGS. 6a through 6d are schematic plans illustrating a method of assembling an optical touch screen according to the present invention.

The method of assembling an optical touch screen according to the present invention is to first prepare the square ring shaped case (300), as illustrated in FIG. 6a.

Figure 6B:
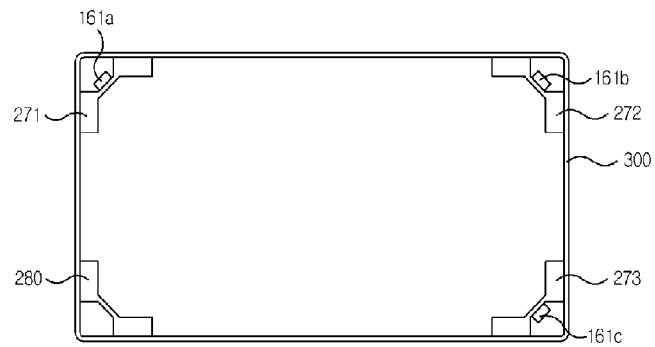

Next, the brackets (271, 272, 273) mounted at three square ring corners of the square ring shaped case (300) are fixed, and the dummy bracket (280) that is not mounted with the camera modules (161a, 161b, 161c) is fixed at one inner lateral corner of the square ring shaped case (300) (FIG. 6b).

In the brackets (271, 272, 273) mounted with the camera modules (161a, 161b, 161c), infrared is emitted from the camera modules (161a, 161b, 161c) and the brackets (271, 272, 273) are formed with openings (not shown) through which the infrared can be incident reflected from the retro reflector (170). The dummy bracket (280) is not formed with an opening which is not needed.

Figure 6C:
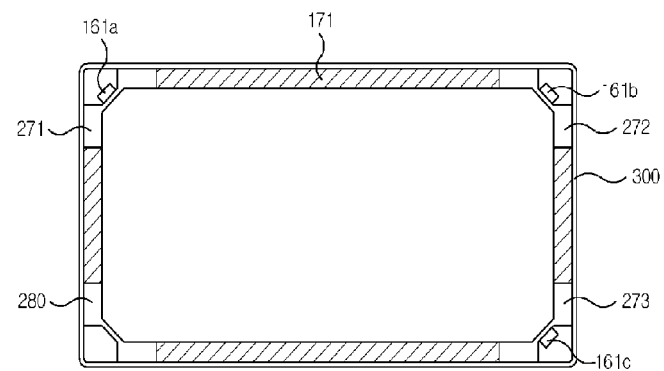
Figure 6D:
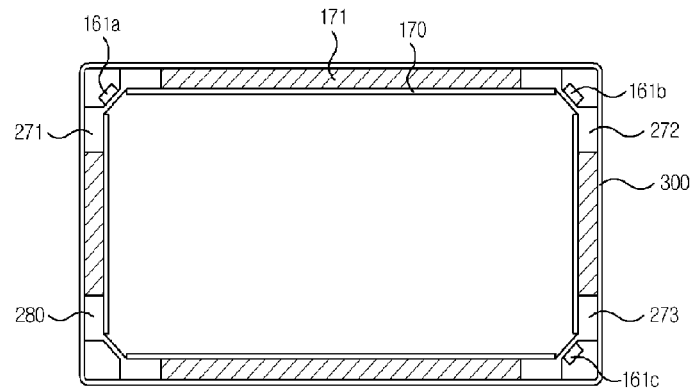

Successively, an inner lateral surface of the case in the brackets (271, 272, 273, 280) is mounted with a frame (171) for fixing the retro reflector (170) (FIG. 6c). Referring to FIG. 6c, the brackets (271, 272, 273, 280) means the brackets (271, 272, 273) that are mounted with camera modules (161a, 161b, 161c) and the dummy bracket (280) that is not mounted with camera module.

Thereafter, the retro reflector (170) is fixed at the frame (171) and the dummy bracket (280) (FIG. 6d), where the retro reflector (170) can be fixed without blocking each opening of the brackets (271, 272, 273) mounted with camera modules (161a, 161b, 161c). Following the assembly process of FIG. 6d, the flat plate display panel (200) is mounted on the case (300).

Therefore, the optical touch screen according to the present invention includes a flat plate display panel; a square ring-shaped case (300) mounted and assembled with the flat plate display panel; brackets (271, 272, 273, 280) assembled at each corner of the case (300); a frame (171) mounted at an inner lateral surface of case among the brackets (271, 272, 273, 280), camera modules (161a, 161b, 161c) mounted at each bracket; and a retro reflector mounted on the frame (171).

Figure 7:
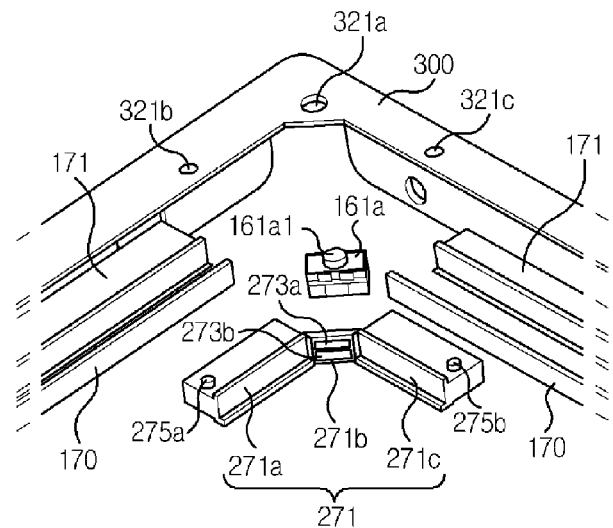
FIG. 7 is a schematic partial perspective view illustrating a method for assembling an optical touch screen according to the present invention.

FIG. 7 is a schematic partial perspective view illustrating a method for assembling an optical touch screen according to the present invention.

The bracket (271) mounted with the camera module (161a) includes first and second fixtures (271a, 271c) fixed on the case, and a connection (271b) connected to the first and second fixtures (271a, 271c).

The method for assembling the optical touch screen first includes mounting the camera module (161a) to the connection (271b) of the bracket (271), where the connection (271b) of the bracket (271) may include a first passage (273a) through which infrared (IR) emitted from the camera module (161a) can pass, and a second passage (273b) through which infrared (IR) incident on the camera module (161a) can pass.

The first and second passages (273a, 273b) may be also implemented by openings formed at the connection (271b) of the bracket (271), as illustrated in FIG. 7, but configuration of which is not limited thereto.

Thereafter, the bracket (271) mounted with the camera module (161a) is mounted at each corner of the case (300).

To be more specific, as shown in FIG. 7, the camera module (161a) is formed with a first fastening lug (161a1), the first and second fixtures (271a, 271c) of the bracket (271) are formed with second and third fastening lugs (275a, 275b), and the case (300) is formed with first, second and third fastening holes (321a, 321b, 321c) corresponding to the first, second and third fastening lugs (161a1, 275a, 275b), wherein the first, second and third fastening lugs (161a1, 275a, 275b) are inserted into the first, second and third fastening holes (321a, 321b, 321c) to allow the camera module (161a) and the bracket (271) to be mounted at the case (300).

Successively, the frame (171) is mounted on the case (300), and the retro reflector (170) is mounted on the frame (171). At this time, the retro reflector (170) may be mounted on the first and second fixtures (271a, 271c) of the bracket (271).

Therefore, the present invention has an advantage in that a camera module can be easily mounted on a case through a bracket, a retro reflector can be easily assembled on a frame mounted on the case, and each constituent element can simply perform a mechanical arrangement for normally realizing an operational mechanism of an optical touch screen. Furthermore, the present invention has another advantage in that the camera module and the retro reflector need no mount on a high-priced reinforced glass to reduce the manufacturing cost.

Figure 8A:
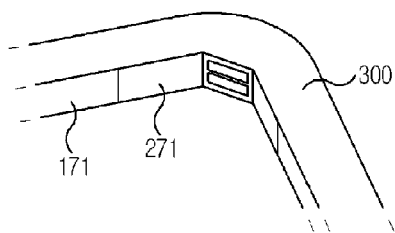
FIGS. 8a and 8b are schematic partial perspective view illustrating in detail a process of attaching a retro reflector in a method for assembling an optical touch screen according to the present invention.
Figure 8B:
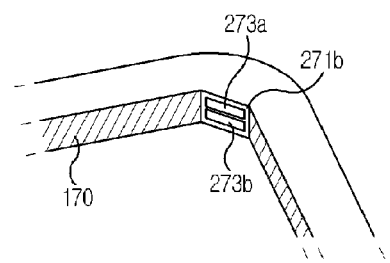

FIGS. 8a and 8b are schematic partial perspective view illustrating in detail a process of attaching a retro reflector in a method for assembling an optical touch screen according to the present invention.

Referring to FIG. 8a, the bracket (271) mounted with the camera module (161a) and the frame (171) are mounted on the case (300), and then, as shown in FIG. 8b, the retro reflector (170) is mounted on the frame (171) and a partial area of the bracket (271).

At this time, only the connection (271b) of the bracket (271) is exposed, and the retro reflector (170) is encompassed by the inner lateral surface of the case (300) to reflect the IR, where the IR emitted from the camera module (161a) is emitted through the first passage (273a) of the connection (271b) at the bracket (271), and the emitted IR is reflected from the retro reflector (170) to enter the second passage (273b). Therefore, the IR emitted from the camera module (161a) does not interfere with the incident IR.

Meanwhile, the frame (171) and the partial area of the bracket (271) may be formed with a groove and the retro reflector (170) may be formed with a lug insertable to the groove (171a).

Thus, the present invention has an advantage in that the retro reflector (170) can be easily fastened to the frame (171) and the bracket (271), by way of shield bar (rail) coupling method, by grooves formed at the frame (171) and the bracket (271), and the lug formed on the retro reflector (170).

Alternatively, in a case guides are respectively formed on an upper surface and a bottom surface of the frame (171) and the bracket (271), an area between the guides is concavely formed to allow the retro reflector (170) to be inserted into the concave area between the guides. That is, the retro reflector (170) can be fastened to the frame (171) and the bracket (271) by way of shield bar (rail) coupling method.

Figure 9:
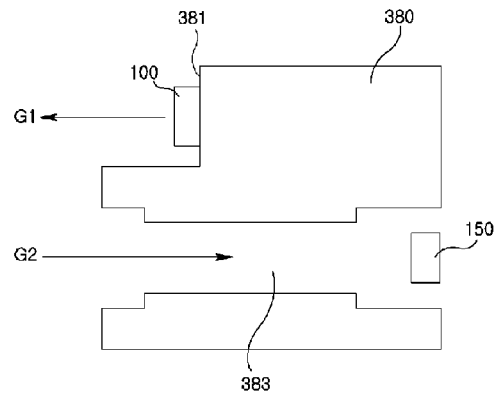
FIG. 9 is a schematic cross-sectional view illustrating a camera module according to the present invention.

FIG. 9 is a schematic cross-sectional view illustrating a camera module according to the present invention.

Referring to FIG. 9, the camera module includes a holder (380) formed with a stair unit (381) and an opening (383); an IR emitting diode (100) mounted at the stair unit (381) for emitting IR (G1); and an image sensor (150) for detecting the IR (G2) through the opening (383).

The stair unit (381) may be formed at an upper surface of the holder (380), and the opening (383) may be formed at a bottom surface of the holder (380).

Thus, the stair unit (381) and the opening (383) are formed at a different area of the holder (380) to prevent the IR (G1) emitted from the IR emitting diode (100) from being interfered by the IR (G2) through the opening (383), such that the IR incident on the image sensor (150) is free from the IR (G1) components emitted from the IR emitting diode (100).

Therefore, the camera module according to the present invention has an advantage in that the image sensor (150) is so positioned as to allow the stair unit (381) of the holder (380) to be mounted with the IR emitting diode (100), and the IR (G2) to be detected through the opening (383), thereby preventing the IR emitted from the IR emitting diode (100) from entering the image sensor (150). That is, the camera module according to the present invention is assembled in a two-tier structure where a light emitting unit and a light receiving unit are separately disposed as shown in FIG. 8.

Figure 10:
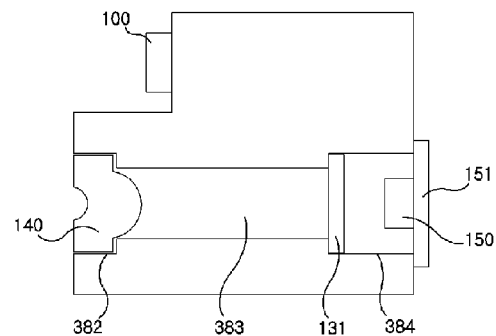
FIG. 10 is schematic cross-sectional view illustrating a camera module according to an exemplary embodiment of the present invention.

FIG. 10 is schematic cross-sectional view illustrating a camera module according to an exemplary embodiment of the present invention.

Now, an exemplary embodiment of the camera module will be illustrated with reference to FIG. 10.

The camera module includes a holder (380) formed at one side with a first groove (381) and formed at the other side with a second groove (384), where an opening (383) connects the first groove (381) and the second groove (384), a stair unit (381) is formed at an upper surface of the one side of the holder (380), the first groove (381) is formed with an objective lens (140), the second groove (384) is formed with an infrared pass filter (131) that passes an infrared of a particular wave band, and a printed circuit board (151) mounted with the image sensor (150) is attached to the holder (380) for blocking the second groove (384), and the stair unit (381) is mounted with the IR emitting diode (100).

At this time, the IR pass filter (131) may be implemented by coating on a glass an IR pass filter material that passes an infrared of a particular wave band, where the glass functions as a cover plate protecting the image sensor. Furthermore, the stair unit (381) is mounted with the IR emitting diode (100).

Therefore, the IR emitted from the IR emitting diode (100) advances to an upper surface of the flat plate display panel, and the IR reflected from the retro reflector passes the objective lens (140) and the IR pass filter (131) that passes an infrared of a particular wave band to be incident on the image sensor (150), whereby touch can be detected.

MODE FOR THE INVENTION

Figure 11:
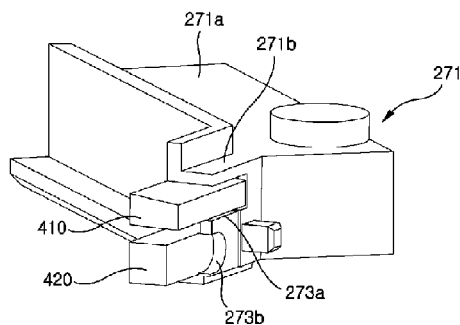
FIG. 11 is a schematic partially cut-out perspective view illustrating a state where an IR pass filter is mounted to a bracket according to the present invention.
Figure 12:
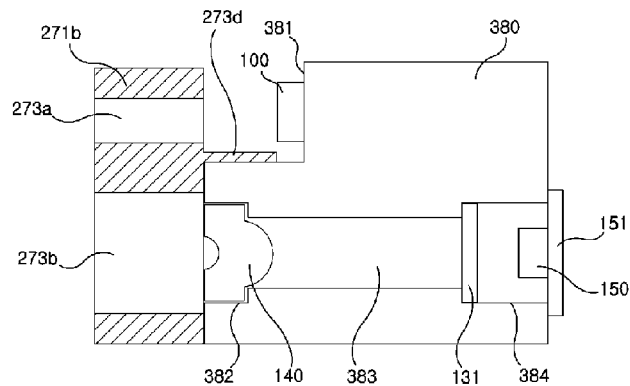
FIG. 12 is a schematic cross-sectional view illustrating a connected relationship between a camera module and a bracket according to the present invention.

FIG. 11 is a schematic partially cut-out perspective view illustrating a state where an IR pass filter is mounted to a bracket according to the present invention, and FIG. 12 is a schematic cross-sectional view illustrating a connected relationship between a camera module and a bracket according to the present invention.

The camera module is mounted at a rear surface of the connection (271b) of the bracket (271), and first and second infrared pass filters (410, 420) are mounted at a front surface of the connection (271b) of the bracket (271). At this time, the first infrared pass filter (410) is aligned on the first passage (273a) of the connection (271b) at the bracket (271), and the second infrared pass filter (420) is aligned on the second passage (273b), as illustrated in FIG. 12.

Furthermore, a light leakage prevention lug (273d) may be formed between the first and second passages (273a, 273b) of the connection (271b) at the bracket (271)

At this time, in a case the camera module is mounted at the connection (271b) of the bracket (271), the light leakage prevention lug (273d) is accommodated at the stair unit (381) mounted with the infrared light emitting diode (100), such that the infrared emitted from the infrared light emitting diode (100) advances only to the first passage (273a), instead of entering the image sensor (150).

Therefore, the present invention is such that the camera module can be optically aligned by a simple assembly process of mounting the first and second infrared pass filters (410, 420) with the connection (271b) of the bracket (271) to advantageously simplify the processes.

Furthermore, the connection (271b) of the bracket (271) is formed with the light leakage prevention lug (273d), and the camera module and the bracket are so coupled as to allow the stair unit (381) mounted with the infrared light emitting diode (100) to be accommodated with the light leakage prevention lug (273d), whereby the infrared emitted from the infrared light emitting diode (100) is advantageously prevented from entering the image sensor (150).

The previous description of the present invention is provided to enable any person skilled in the art to make or use the invention. Various modifications to the invention will be readily apparent to those skilled in the art, and the generic principles defined herein may be applied to other variations without departing from the spirit or scope of the invention. Thus, the invention is not intended to limit the examples described herein, but is to be accorded the widest scope consistent with the principles and novel features disclosed herein.

INDUSTRIAL APPLICABILITY

The present invention has an industrial applicability in that a frame and a bracket are formed with grooves, and a retro reflector is formed with a lug to allow the retro reflector to be easily fastened on the frame and the bracket by way of shield bar (rail) coupling method.

The invention claimed is:

1. An optical touch screen, the optical touch screen comprising:
   a flat plate display panel;
   a case mounted and assembled with the flat plate display panel;
   brackets assembled at each corner of the case;
   a camera module mounted at each bracket; and
   a retro reflector arranged along an inner lateral surface of the case,
   wherein the optical touch screen further includes a frame mounted at an inner lateral surface between the brackets, wherein the retro reflector is mounted at the frame, and
   wherein the frame is formed with a groove, and the retro reflector is formed with a lug insertable to the groove, wherein the lug formed at the retro reflector is inserted into the groove formed at the frame, whereby the retro reflector is mounted at the frame.

2. The optical touch screen of claim 1, wherein the case takes the shape of a square ring.

3. The optical touch screen of claim 1, wherein the brackets include first and second fixtures fixed on the case, and a connection connected to the first and second fixtures, wherein the camera module is mounted at the connection.

4. The optical touch screen of claim 3, wherein the connection of the bracket includes a first passage through which infrared (IR) emitted from the camera module can pass, and a second passage through which infrared (IR) incident on the camera module can pass.

5. The optical touch screen of claim 3, wherein the retro reflector is mounted on the first and second fixtures.

6. The optical touch screen of claim 1, wherein the camera module includes an IR emitting diode emitting IR; an IR pass filter passing only the IR reflected from the retro reflector; and a linear sensor detecting an area touched by incidence of IR that has passed the IR pass filter.

7. An optical touch screen, the optical touch screen comprising:
   a flat plate display panel;
   a case mounted and assembled with the flat plate display panel;
   brackets assembled at each corner of the case;
   a camera module mounted at each bracket; and
   a retro reflector arranged along an inner lateral surface of the case,
   wherein the camera module includes a holder formed with a stair unit and an opening; an IR emitting diode mounted at the stair unit for emitting IR; and an image sensor detecting the IR through the opening.

8. The optical touch screen of claim 7, wherein the stair unit is formed at an upper surface of the holder, and the opening is formed at a bottom surface of the holder.

9. The optical touch screen of claim 7, wherein the holder is formed at one side with a first groove and is formed at the other side with a second groove, and the opening connects the first groove and the second groove, and the stair unit is formed at an upper surface of the one side.

10. The optical touch screen of claim 9, wherein the first groove is formed with an objective lens, the second groove is formed with an infrared pass filter that passes an infrared of a particular wave band, and a printed circuit board mounted with the image sensor is attached to the holder for blocking the second groove.

11. The optical touch screen of claim 10, wherein the IR pass filter is implemented by coating an IR pass filter material on a glass.

12. A method for assembling an optical touch screen, the method comprising:
   preparing a bracket mounted with a camera module and a case;
   fixing the bracket at each corner of the case;
   fixing a retro reflector on the case; and
   mounting a flat plate display panel on the case,
   wherein the brackets include first and second fixtures fixed on the case, and a connection connected to the first and second fixtures, wherein the camera module is mounted at the connection, and
   wherein the camera module is formed with a first fastening lug, the first and second fixtures of the bracket are formed with second and third fastening lugs, and the case is formed with first, second and third fastening holes corresponding to the first, second and third fastening lugs, wherein the first, second and third fastening lugs are inserted into the first, second and third fastening holes to allow the camera module and the bracket to be mounted at the case.

13. A method for assembling an optical touch screen, the method comprising:
   preparing a bracket mounted with a camera module and a case;
   fixing the bracket at each corner of the case;
   fixing a retro reflector on the case; and
   mounting a flat plate display panel on the case,
   wherein the step of fixing the bracket at each corner of the case is performed in such a manner that three inner corners of the square ring-shaped case are fixed by brackets on which the camera module is mounted, and one inner corner of the square-ring shaped case is mounted with a dummy bracket on which the camera module is not mounted.

14. A method for assembling an optical touch screen, the method comprising:
   preparing a bracket mounted with a camera module and a case;
   fixing the bracket at each corner of the case;
   fixing a retro reflector on the case; and
   mounting a flat plate display panel on the case,
   wherein the camera module includes a holder formed with a stair unit and an opening; an IR emitting diode mounted at the stair unit for emitting IR; and an image sensor detecting the IR through the opening.

15. The method of claim 14, wherein the stair unit is formed at an upper surface of the holder, and the opening is formed at a bottom surface of the holder.

16. The method of claim 14, wherein the holder is formed at one side with a first groove and is formed at the other side with a second groove, and the opening connects the first groove and the second groove, and the stair unit is formed at an upper surface of the one side.

\* \* \* \* \*